(12) United States Patent
Lima et al.

(10) Patent No.: US 7,420,806 B1
(45) Date of Patent: Sep. 2, 2008

(54) AIRFLOW DISTRIBUTION THROUGH AN ELECTRONIC DEVICE

(75) Inventors: David J. Lima, Los Altos, CA (US); Eric R. Prather, Santa Clara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 204 days.

(21) Appl. No.: 11/285,550

(22) Filed: Nov. 22, 2005

(51) Int. Cl.
*H05K 7/20* (2006.01)
*H05K 5/00* (2006.01)

(52) U.S. Cl. .................. 361/695; 361/690; 165/104.33; 165/122; 454/184

(58) Field of Classification Search ........................ None
See application file for complete search history.

(56) References Cited

U.S. PATENT DOCUMENTS

| | | | | | |
|---|---|---|---|---|---|
| 5,210,680 | A * | 5/1993 | Scheibler | .................... | 361/695 |
| 5,914,858 | A * | 6/1999 | McKeen et al. | ............. | 361/695 |
| 5,969,942 | A * | 10/1999 | Heckner et al. | ............. | 361/695 |
| 5,995,368 | A * | 11/1999 | Lee et al. | .................... | 361/695 |
| 6,000,464 | A * | 12/1999 | Scafidi et al. | .......... | 165/104.33 |
| 6,047,836 | A * | 4/2000 | Miles | ...................... | 211/41.17 |
| 6,181,557 | B1 * | 1/2001 | Gatti | .......................... | 361/695 |
| 6,278,608 | B1 * | 8/2001 | Ater et al. | .................... | 361/695 |
| 6,377,470 | B1 * | 4/2002 | Hayward et al. | ............ | 361/796 |
| 6,504,717 | B1 * | 1/2003 | Heard | ......................... | 361/695 |
| 6,565,428 | B2 * | 5/2003 | Hsiao | .......................... | 454/184 |
| 6,746,502 | B2 * | 6/2004 | Yair et al. | .................. | 55/385.6 |
| 6,837,785 | B2 * | 1/2005 | Soderlund | .................... | 454/184 |
| 6,896,612 | B1 * | 5/2005 | Novotny | ...................... | 454/184 |
| 6,912,129 | B2 * | 6/2005 | Baker et al. | .................. | 361/695 |
| 7,031,154 | B2 * | 4/2006 | Bash et al. | ................... | 361/690 |
| 7,079,387 | B2 * | 7/2006 | Brooks et al. | ................ | 361/687 |
| 7,215,552 | B2 * | 5/2007 | Shipley et al. | .............. | 361/721 |
| 7,259,961 | B2 * | 8/2007 | Lucero et al. | ............... | 361/695 |
| 2005/0078449 | A1 * | 4/2005 | Makooi et al. | .............. | 361/695 |
| 2007/0211428 | A1 * | 9/2007 | Doll | ........................... | 361/695 |

* cited by examiner

*Primary Examiner*—Boris L Chervinsky
(74) *Attorney, Agent, or Firm*—Shumaker & Sieffert, P.A.; Daniel T. Luno; Kent J. Sieffert

(57) ABSTRACT

Techniques for distributing airflow for cooling an electronic device are described. Vanes positioned immediately after a set of cooling fans direct airflow over a plurality of components within the device. For example, the vanes may be designed to segment the net fan blade travel area into equal sections—one section per component—to accomplish balanced airflow distribution. Components requiring cooling include cards, e.g., printed circuit boards and the like. A plurality of cards may form slots between the cards and the vanes may divide the airflow equally among the slots to provide consistent cooling for each of the cards. Embodiments of the invention may be directed to distributing cooling airflows within a computing device, e.g., a network router or a server.

23 Claims, 8 Drawing Sheets

AIRFLOW DISTRIBUTION THROUGH AN ELECTRONIC DEVICE

TECHNICAL FIELD

The invention relates to controlling airflow through an electronic device.

BACKGROUND

Electronic devices that consume a large amount of power often create heat that needs to be removed during operation. For this reason, many electronic devices include cooling fans. For example most computers and other computing devices include cooling fans. For some devices, it is important not only to cool the device in general, but to ensure each component of the device is adequately cooled. For example, devices having numerous of printed circuit boards spaced closely together leave small air gaps (slots) between the cards, and may require a certain amount of air to pass through each slot to keep the individual components on each card adequately cooled.

Cooling fans create turbulent airflow on the downstream side of the fan. In a device including a plurality of cards spaced closely together, the turbulent airflow often results in unequal flow rates through the slots formed between the cards. In order to assure adequate airflow through each slot, larger or more fans may be used in the device even though the total airflow is theoretically sufficient to cool each component of the device. One alternative is to use ducting to direct airflow to each slot. Another is to use baffles to limit airflow in slots that would otherwise receive more airflow than necessary in order to force the flow to other slots. Another possibility is a plenum pressure equalization chamber, which provides a large space for turbulent airflow to equalize into a consistent pressure across the chamber. The calm air and even pressure on the downstream side of the chamber means air exits equal sized outlets of the chamber at equal flow rates.

However, each of these techniques has disadvantages. Larger or extra fans take up additional space, are more expensive and consume excess power. Ducting or plenum pressure equalization chambers can take up even more space than having extra fans. Baffles increase the overall pressure in the system and may require use of larger or more fans than otherwise theoretically necessary. In other words, current techniques for directing airflow often result in electronic device designs resulting in an inefficient use of power, space and/or production resources.

SUMMARY

In general, the invention is directed to techniques for distributing airflow in an electronic device. Vanes positioned immediately after a set of cooling fans direct airflow over a plurality of components within the device. For example, the vanes may be designed to segment the net fan blade travel area into equal sections—one section per component—to accomplish balanced airflow distribution. For example, an electronic device may include plurality of cards forming slots between the cards. The cards may be printed circuit boards or other electronic components requiring cooling. The vanes may divide the airflow equally among the slots to provide consistent cooling for each of the cards. Embodiments of the invention may be directed to distributing cooling airflows within a computing device, e.g., a network router or a server.

In one embodiment, an electronic device comprises one or more fans that contribute to an airflow through the electronic device and a plurality of vanes adjacent to a downstream side of the one or more fans. The plurality of vanes direct the airflow in more than one direction over a plurality of components in the electronic device.

In another embodiment, a vane tray comprises a frame sized to fit within an electronic device and a plurality of vanes within the frame. When in the presence of a airflow, the plurality of vanes serve to direct an airflow in more than one direction over a plurality of components in the electronic device.

In an embodiment, a method comprises dividing a net fan blade travel area of a cooling fan into a plurality of sections, and positioning vanes within an electronic device to allocate airflow from each of the sections of the net fan blade travel area to a different component of the electronic device.

Embodiments of the invention may provide one or more of the following advantages. For example, embodiments of the invention may balance flow distribution over a plurality of components in an electronic device. This may reduce the size and power consumption of cooling fans required to adequately cool each component within a device. Furthermore, embodiments of the invention may provide an alternative to other techniques for balancing airflow, e.g., ducting or baffles. As compared to alternative techniques, embodiments of the invention may balance airflow over a plurality of components in an electronic device more efficiently in terms of space required, power consumption, manufacturing costs and operating costs.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
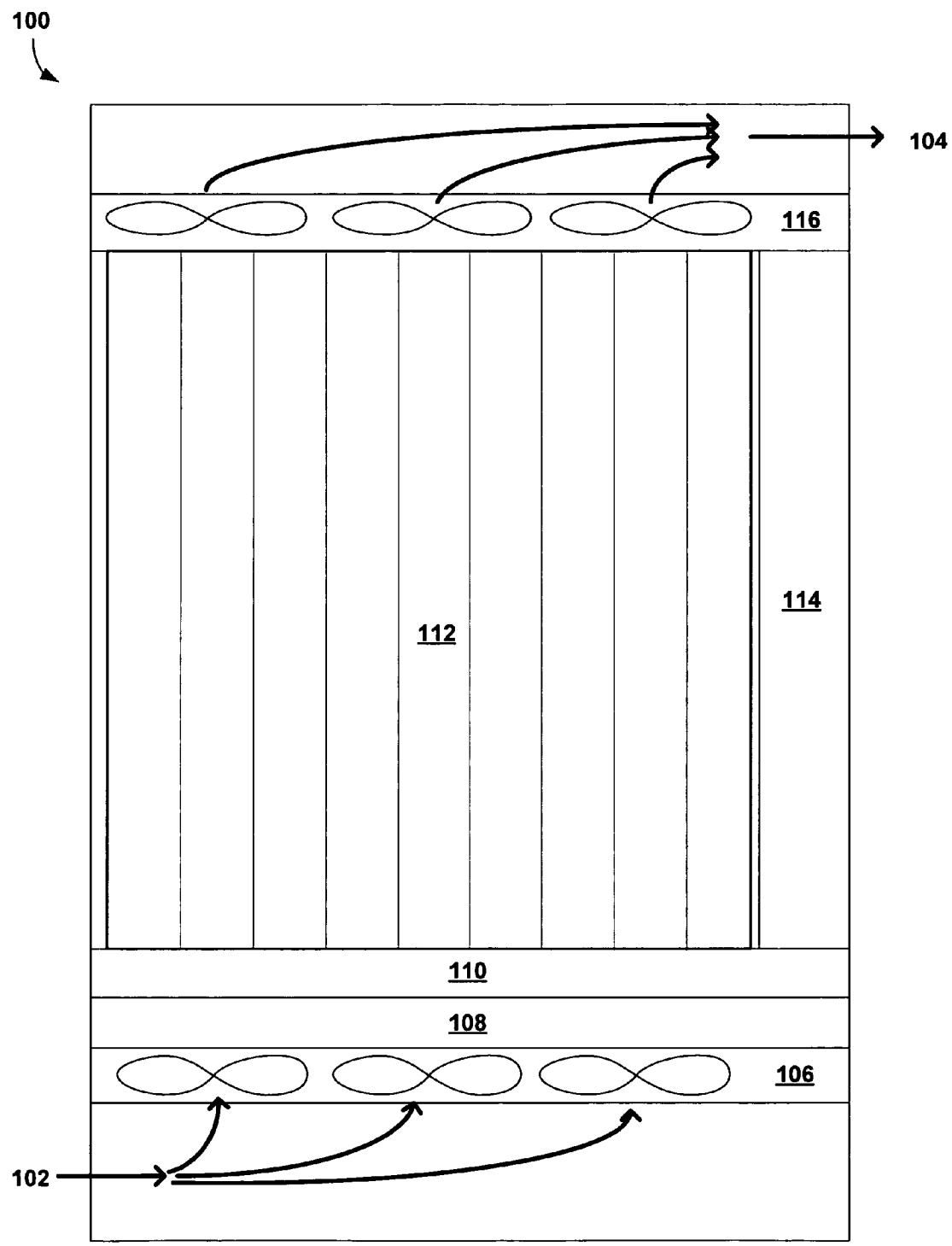
FIG. 1 is an illustration showing inlet and outlet airflow paths through an electronic device.

FIG. 1 is an illustration showing inlet airflow path 102 and outlet airflow path 104 through electronic device 100. Electronic device 100 includes bottom fan tray 106, vane tray 108, filter 110, cards 112, power supply 114 and top fan tray 116. Bottom fan tray 106 and top fan tray 116 each incorporate a plurality of fans to create airflow through electronic device 100. With respect to all components of electronic device 100, an upstream side of the airflow is the side of the component closest to inlet airflow path 102 and a downstream side of the airflow is the side of the component closest to outlet airflow path 104. The airflow provides cooling for components of electronic device 100 and is specifically designed to cool cards 112.

Cards 112 are electronic components of electronic device 100, and the cards may be inserted or removed from the electronic device depending the desired configuration. For example, electronic device 100 may be a router, and cards 112 may be removable interface cards (e.g., printed circuit boards) that provide network connectivity or service cards that provide network services. Cards 112 require cooling during the operation of electronic device 100. Slots (i.e., air gaps) formed between cards 112 allow the airflow to reach each of cards 112.

Vane tray 108 includes vanes that receives turbulent airflow from fans of fan tray 106 and direct the airflow to cool cards 112. For example, vane tray 108 may function to divide the airflow equally among slots formed by cards 112. This creates a balanced airflow within the slots to cool each of cards 112 equally. The design of the vanes may be optimized to reduce the pressure drop of the airflow over vane tray 108 by a minimal amount. Vane tray 108 is a removable component of electronic device 100.

Vanes in vane tray 108 may be adjustable and configurable based upon the requirements of electronic device 100. For example, if one or more of cards 112 is removable, vanes in vane tray 108 may be adjusted to allocate airflow equally among the remaining slots formed by cards 112. Vanes could also be adjusted to provide additional airflow to some slots as compared to other slots. Adjustments to vane tray 108 may be a permanent design change, a temporary adjustment or an equipment upgrade in the field. In some embodiments, vanes in vane tray 108 may be fixed. Adjustments to vanes in vane tray 108 may then require replacing or moving vane tray 108.

Filter 110 serves to trap or remove particles from the airflow. Filter 110 may include a replaceable filter element or a permanent filter element. Filter 110 may include an electrostatic filter element or a passive filter element. In some embodiments, filter 110 is incorporated as part of vane tray 106. In other embodiments filter 110 is part of a separate filter tray or is a standalone component of electronic device 100. Filter 110 may further reduce turbulence in the airflow on the downstream side of filter 110.

Power supply 114 is shown only as an exemplary configuration of electronic device 100. In other embodiments, a power supply may not be required, may be incorporated with cards 112 or placed in a different location within electronic device 100.

Fan tray 116 includes fans that increase the airflow through electronic device 100. Because fans do not create significant turbulence on their upstream (intake) side, the effect of fans within fan tray 116 on variations in flow rates in slots formed by cards 112 is not as pronounced as fans in fan tray 106. However, vanes within vane tray 108 may be designed and/or positioned to account for any variances in flow rate in slots formed by cards 112 due to fans in fan tray 116 as well as fans in fan tray 106.

Electronic device 100 may be a network device, such as a router, switch, hub, VPN or SSL appliance, intrusion detection device, or other network device. Electronic device 100 may also be a server or other computing device, or any form of electronic device having electrical components that require cooling.

Figure 2A:
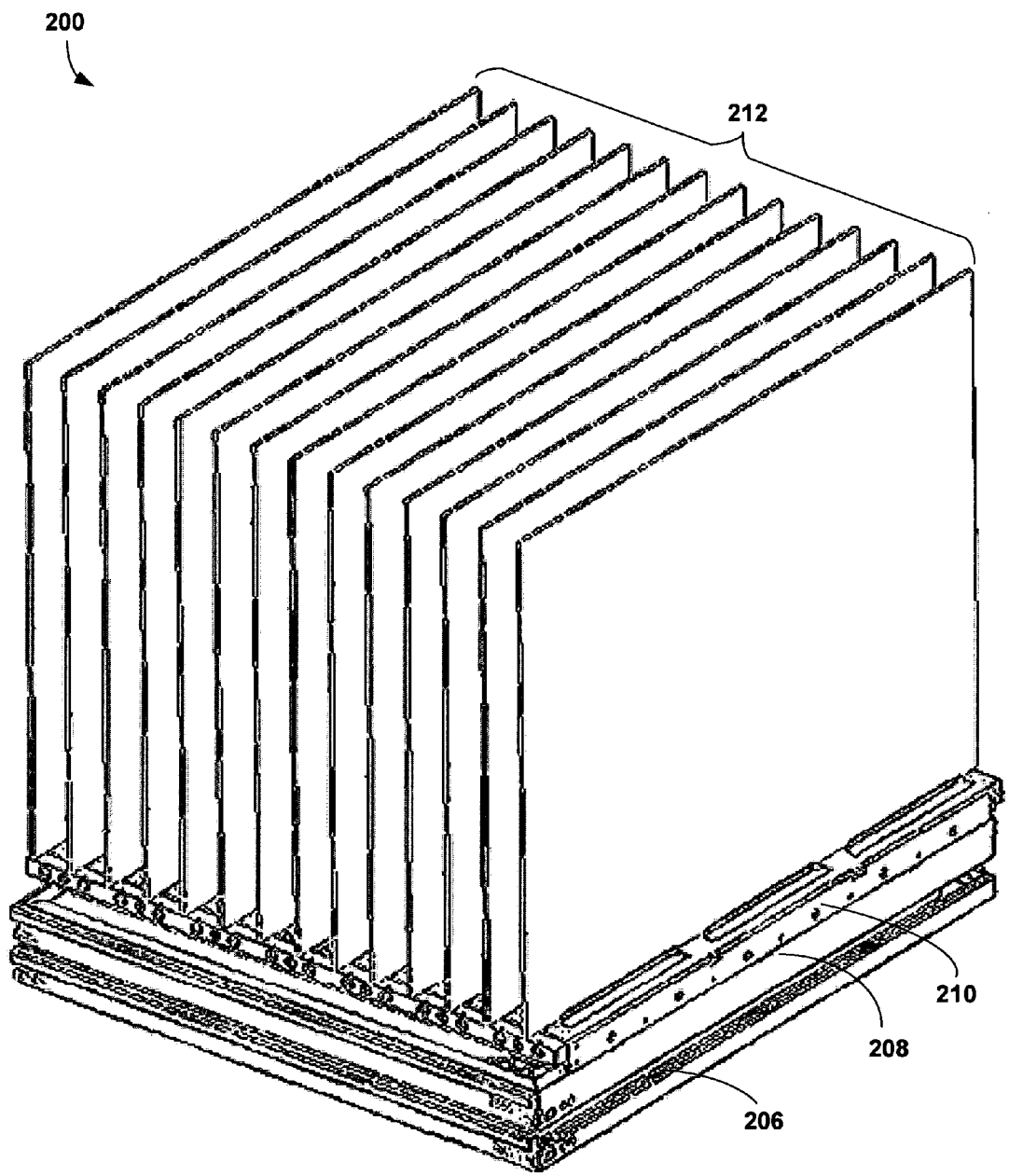
FIGS. 2A-B are illustrations of an assembly including a fan tray, a vane tray, a filter tray and components of an electronic device.
Figure 2B:
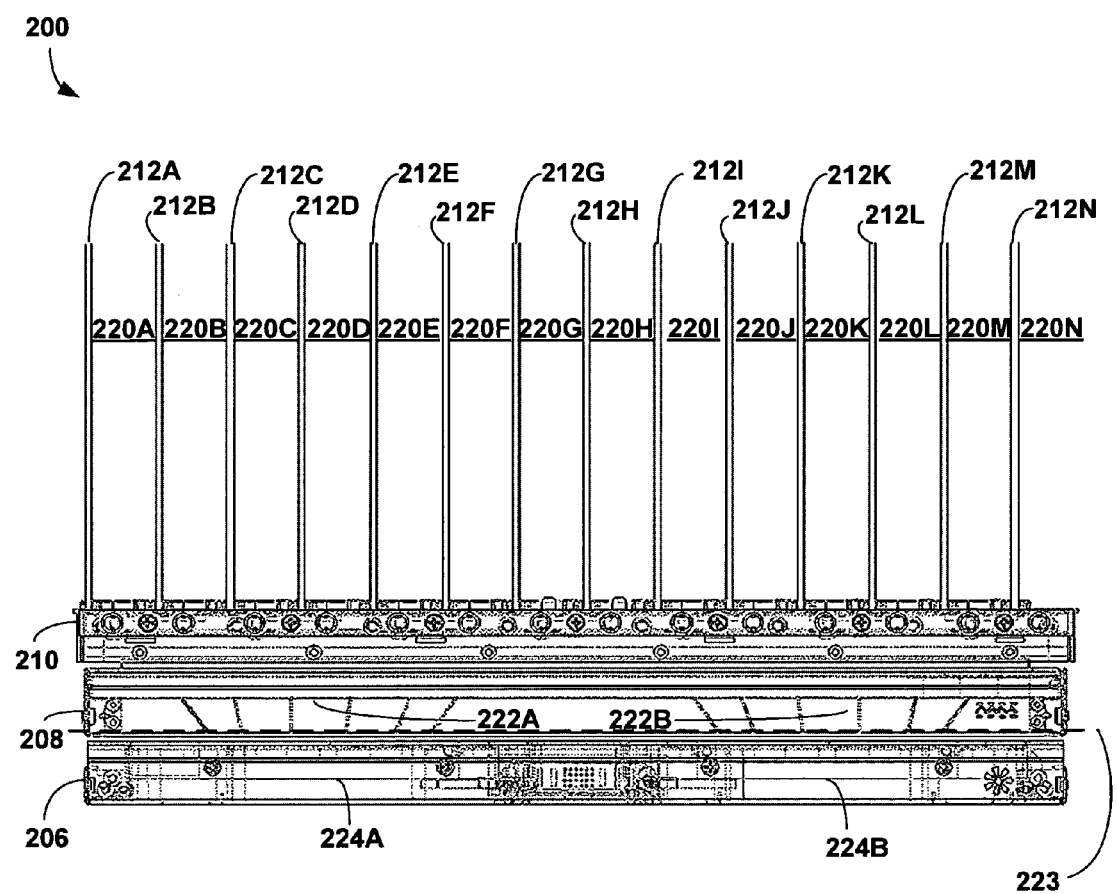

FIGS. 2A-B are illustrations of assembly 200 including fan tray 206, vane tray 208, filter tray 210 and components 212A-N (components 212) of an electronic device. Specifically, FIG. 2A shows assembly 200 in an isometric view, while FIG. 2B shows assembly 200 in a side view.

For example, assembly 200 may be part of electronic device 100 from FIG. 1. The functions of fan tray 206, vane tray 208 and filter tray 210 may be respectively similar to the functions of bottom fan tray 106, vane tray 108 and filter 110 from FIG. 1. Accordingly, details explained with respect to FIG. 1 are not repeated, but expanded on with respect to FIGS. 2A-B.

As shown in FIG. 2B, fan tray 206 includes fans 224A and 224B ("fans 224"). Vane tray 208 includes two sets of vanes 222A and 222B ("vanes 222"). Vanes 222A serve to direct airflow from fan 224A and vanes 222B serve to direct airflow from fan 224B. While not shown in FIGS. 2A-B. Fan tray 206 may include additional fans. Airflow from additional fans is also directed by vanes 222.

Components 212 may be printed circuit boards or other component that require cooling during the operation of the electronic device of assembly 200. Components 212 form slots 220A-N. In assembly 200, each of components 212 corresponds to a single slot 220. In other embodiments, there may be more or less slots 220 as compared to components 212.

Each of vanes 222A and 222B divide airflow among seven slots. More specifically, vanes 222A divide airflow from fan 224A among slots 212A-G, and vanes 222B divide airflow from fan 224B among slots 212H-N. Vanes 222 may be adjustable and configurable based upon the requirements of the electronic device of assembly 200. For example, if component 212D is removed, vanes 222 may be adjusted to allocate airflow equally among the remaining slots 220. If vanes 222 are not adjusted, the combined slot 220C-D formed between components 212C and 212E receives approximately twice the airflow as the rest of slots 220. Adjusting vanes 222 may require replacing vane tray 208 or manually adjusting vanes 222. In either case, adjustments to vanes 222 allow airflow through the electronic device of assembly 200 to be allocated to cool components 212 as necessary.

In some embodiments, vanes 222 include tabs that press fit into indents (not shown) of vane tray 208 to form pivot points for each of vanes 222 at line 223, the upstream side of vanes 222. An operator can manually adjust vanes 222 by rotating them about the pivot points. Vanes 222 can pivot from a horizontal position along line 223, a fully closed position, to at any angle above line 223 to direct airflow into a desired slot 220. In addition, vane tray 208 includes additional indents such that vanes 222 may be spaced at a variety of positions along line 223. An operator can remove a vane from one indent and place it within another indent to form a pivot point for the vane at a different location. Furthermore, an operator can add and remove vanes within vane tray 208 using the indents along line 223. If one of cards 212 is removed, an operator may want to distribute airflow from fans 224 equally among the remaining slots 220, and the operator may optionally remove one of vanes 222 and adjust the spacing and angle of the remaining vanes 222. Once vane tray 208 is adjusted to a desired configuration, vanes 222 maintain their positions because airflow through assembly 200 is not forceful enough to move vanes 222.

Figure 3A:
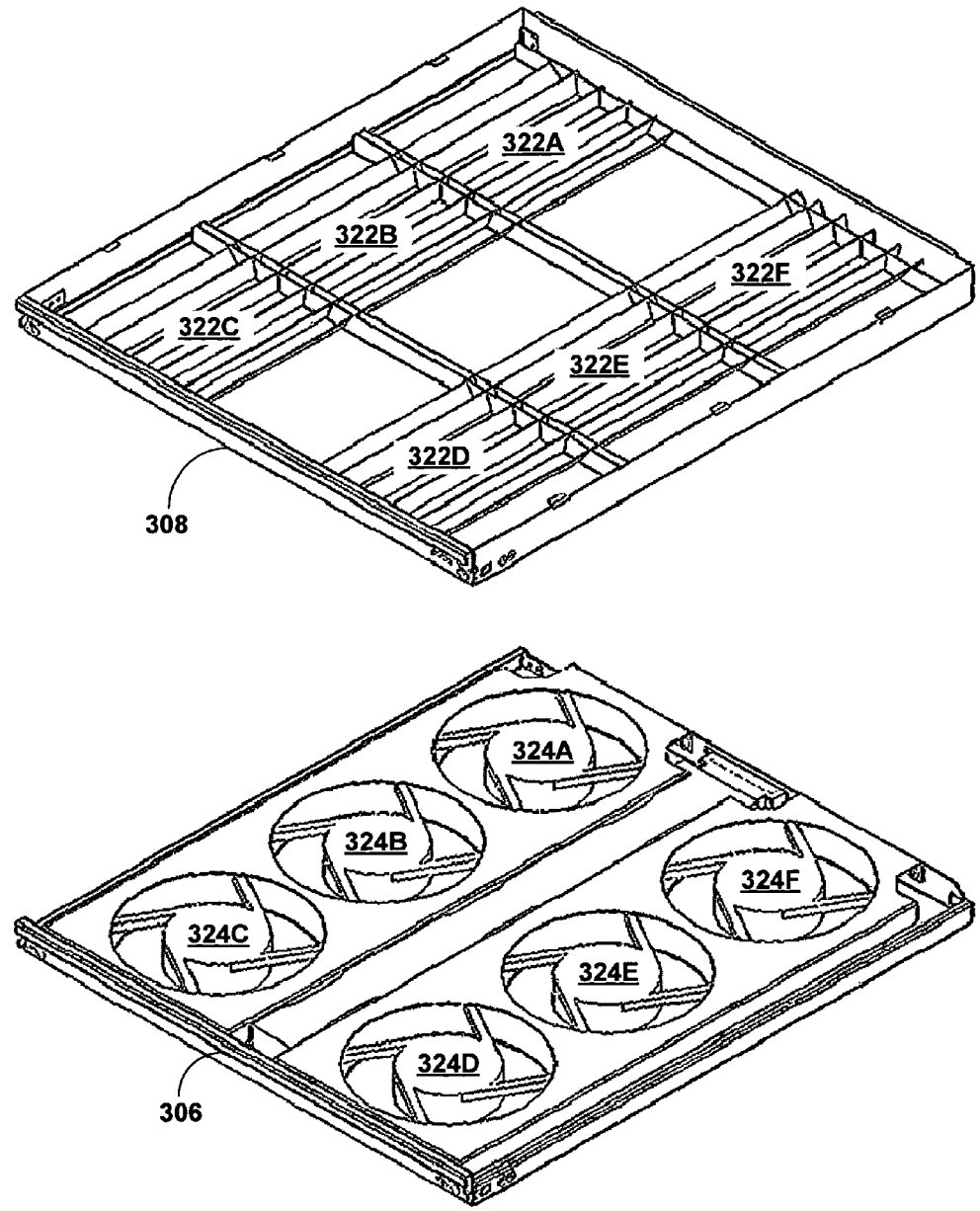
FIGS. 3A-B are illustrations of a fan tray and a vane tray.
Figure 3B:
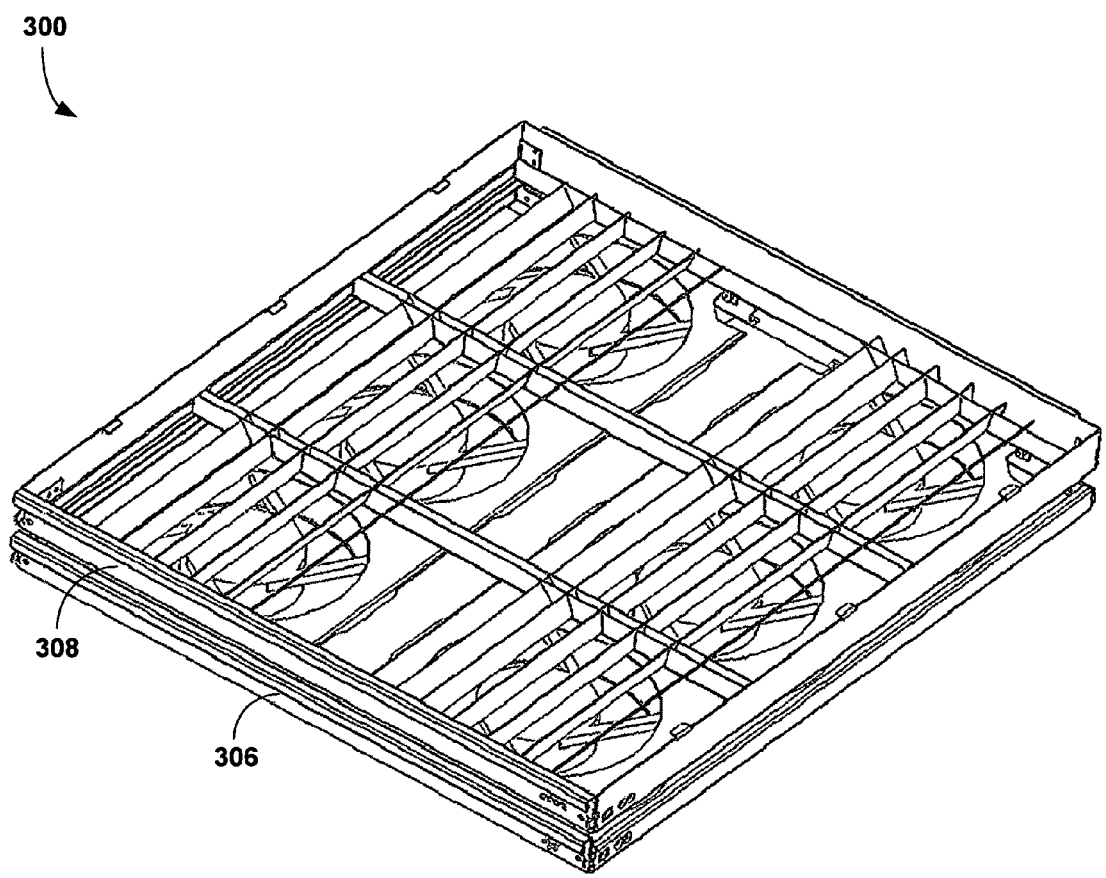

FIGS. 3A-B are illustrations of exemplary embodiments of a fan tray 306 and a vane tray 308 that may be incorporated into an electronic device. Specifically, FIG. 3A shows fan tray 306 and vane tray 308 in an exploded view, and FIG. 3B shows fan tray 306 and vane tray 308 as assembly 300—as they would be in an electronic device. Fan tray 306 contributes to an airflow through the electronic device, vane tray 308 directs the airflow through the device to ensure each component is adequately cooled during operation of the device.

Vane tray 308 includes six sets of vanes 322A-F (vanes 322). Fan tray 306 includes six fans 324A-F (fans 324). Vanes 322A-F correspond to fans 324A-F respectively. In other embodiments, there may be more or less than one set of vanes corresponding to each fan 324. As shown in FIG. 3B, vanes 322 direct airflow from fans 324. Each of vanes 322 can be individually adjusted to direct airflow from fans 324.

For example, vanes 322 may be adjusted to direct airflow over components require cooling of the electronic device. Adjusting vanes 322 may require replacing vane tray 308 or manually adjusting vanes 322. In either case, adjustments to vanes 322 allow airflow through the electronic device of assembly 300 to be allocated to cool components of the device as necessary.

Figure 4:
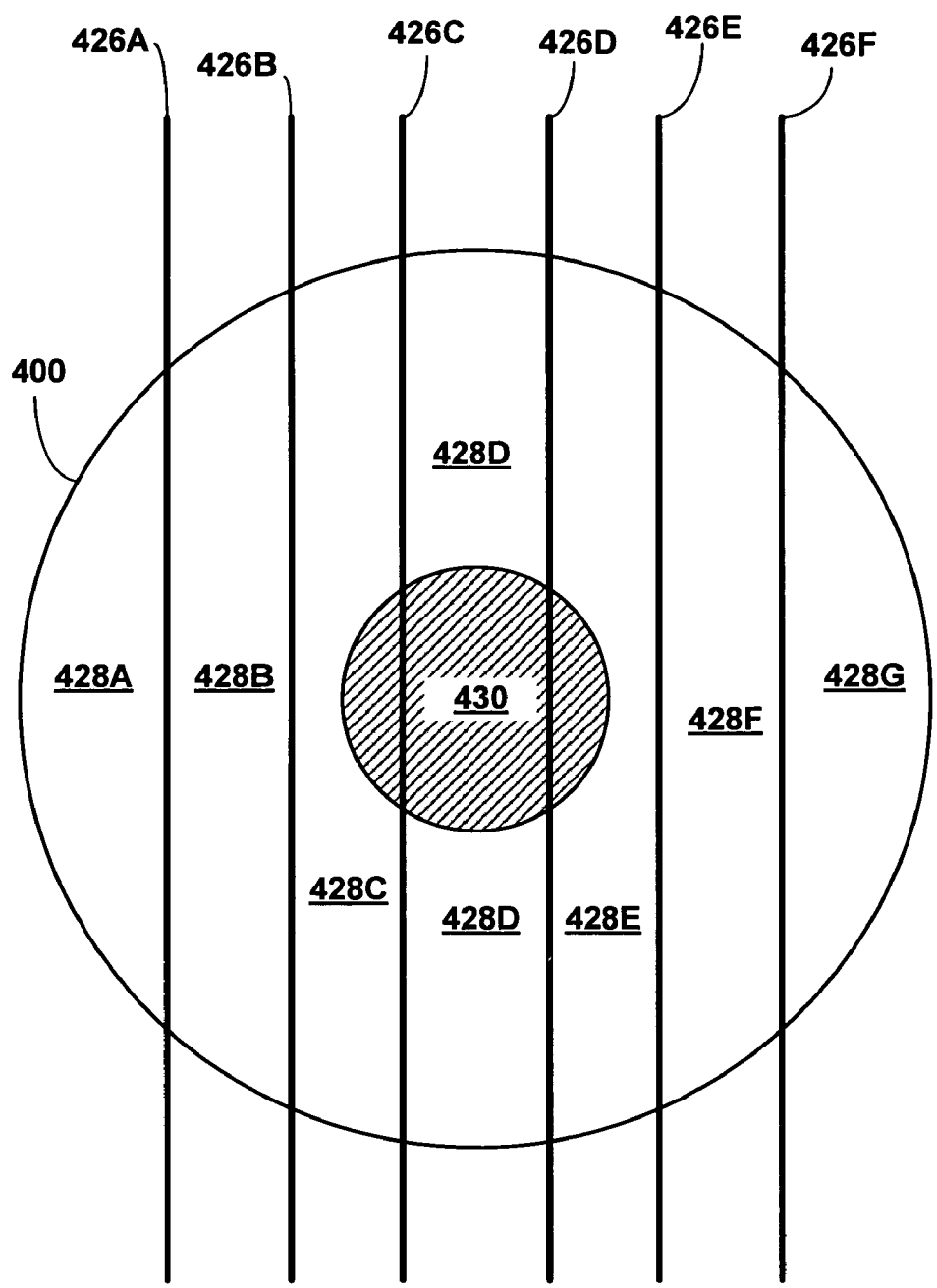
FIG. 4 is an illustration showing a fan blade travel area divided into sections.

FIG. 4 is an illustration showing fan blade travel area 400 divided into sections 428A-G (sections 428). Lines 426 represent the upstream side of a set of vanes adjacent to a fan having fan blade travel area 400. Lines 426A-F (lines 426) divide fan blade travel area 400 into sections 428. As shown in FIG. 4, fan blade travel area 400 does not include center hub 430. For example, a fan having fan blade travel area 400 may have a motor within the area of center hub 430.

The linear velocity at a point on a fan blade is greater as the distance between the point and the center of the fan increases. Fans are commonly design such that the pitch at the inside of a fan blade is steeper than a pitch of the fan blade at the outside of the fan to account for this difference in linear velocity. Therefore, the flow rate throughout fan blade travel area 400 is approximately consistent. For this reason, the size of one of sections 428 is directly related to the flow rate through that section.

Lines 426 divide fan blade travel area 400 into approximately equal sections 428. Lines 426 are spaced at non-equal distances to divide fan blade travel area into approximately equal sections. The spacing of lines 426 accounts for the circular shape of the fan blade travel area as well as center hub 430. Section 428D includes two areas which in combination are approximately equal to the other sections 428. By dividing fan blade travel area 400 into approximately equal sections 428, the flow created by the fan is divided into seven substantially equal sections. Each of the sections corresponds to one of sections 428.

Dividing airflow into substantially equal sections, as accomplished by vanes represented by lines 426, may be useful for efficient allocation of the airflow in order to cool components of an electronic device. For example, if an electronic device includes a plurality of substantially similar components, each component may require the same amount of airflow in order to maintain a proper operating temperature for each component. As an example, a computing device, such as a network router, may contain a plurality of cards forming slots between the cards. Each slot may require a minimum amount of airflow to provide adequate cooling of the cards. By equally distributing airflow among the slots the amount of airflow required to ensure that each slot receives the minimum amount of airflow necessary is minimized.

Figure 5:
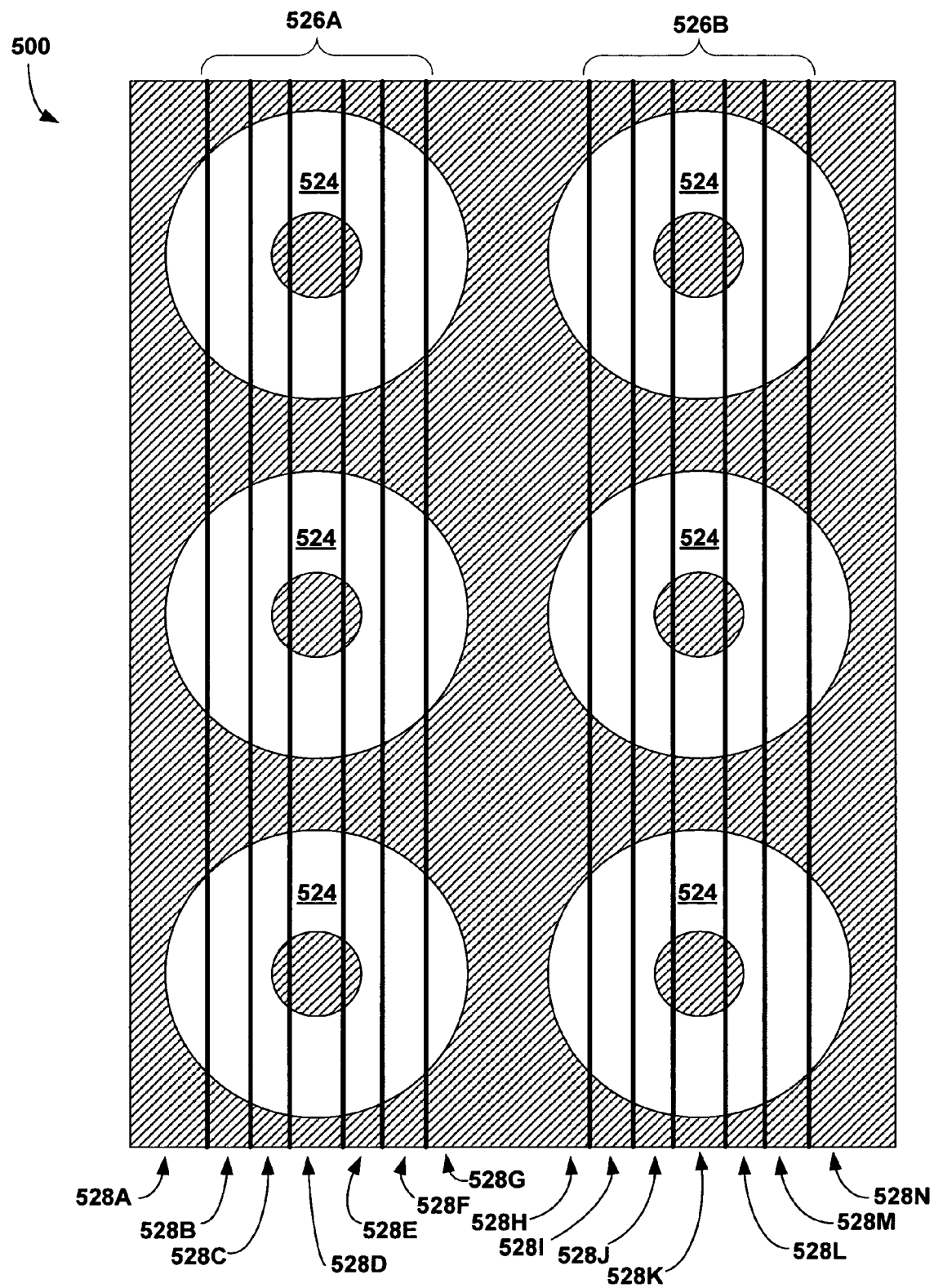
FIG. 5 is an illustration showing a fan tray where the net fan blade travel area is divided into sections.

FIG. 5 is an illustration showing fan tray 500 where the net fan blade travel area 524 is divided into sections 528A-N (sections 528). For example, fan tray 500 may be the same as fan tray 106 in FIG. 1 and fan tray 206 in FIGS. 2A-B. Lines 526A-B (lines 526) represent the upstream side of a set of vanes adjacent to fan tray 500. Lines 526 divide the net fan blade travel area 524 into sections 528.

Net fan blade travel area 524 includes the fan blade travel area of six substantially similar fans. The airflow rate is approximately equal thought out net fan blade travel area 524. Further, the size of each of sections 528 is directly proportional to the flow rate through that section.

As shown in FIG. 5, dividing fan blade travel area 524 into approximately equal sections 528, the flow created by the fans is divided into fourteen substantially equal sections. Each of the sections corresponds to one of sections 528.

Figure 6:
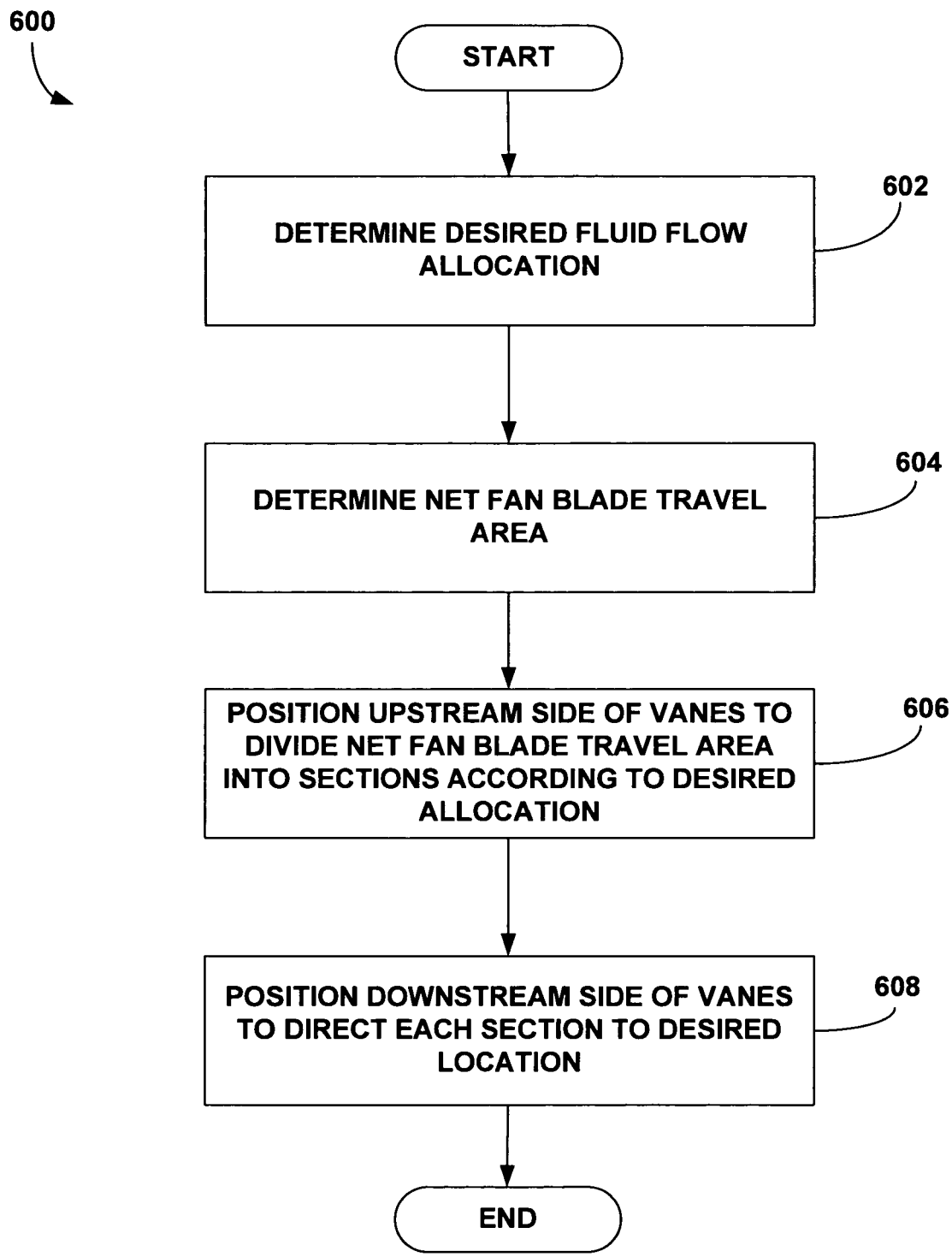
FIG. 6 is block diagram of a method for positioning vanes to direct airflow among components of an electronic device.

FIG. 6 is flowchart of method 600 for positioning vanes to direct an airflow among components of an electronic device. For example, method 600 may be used to position vanes in vane tray 106 of electronic device 100 from FIG. 1.

First, an operator must determine the desired airflow allocation for each of the slots (602). As discussed previously, one possibility is to distribute airflow equally among a plurality of sections. Other distributions are also possible.

Next, the operator determines the net fan blade travel area, which is defined as the sum of the fan blade travel areas of each fan (604). The net fan blade travel area may be calculated, approximated or otherwise determined. One method of calculating a fan blade travel area requires measuring the diameter of a fan's blades ($d_f$) and the diameter of the fan's hub ($d_h$). The fan blade travel area for that fan is then:

$$\frac{\Pi}{4}(d_f^2 - d_h^2) = \text{fan blade travel area} \qquad \text{(Equation 1)}$$

Calculating a net fan blade travel area simply requires summing the fan blade travel areas of every fan.

In the next step, the operator positions the upstream side of vanes adjacent to one or more fans to divide the net fan blade travel area into sections according to the desired airflow allocation for each slot (606). As described with respect to assembly 200 in FIGS. 2A-B, the operator may pivot vanes about points at the upstream side of the vanes. The operator can change the pivot point for a vane by moving it within the vane tray. Furthermore, if desired, the operator can add and remove vanes within the vane tray. It is possible to combine steps 604 and 606 by experimentation. For example, the operator could measure the airflow through each section to produce the desired airflow allocation.

Last the operator positions the downstream side of the vanes to direct each section to the desired location within the electronic device (608). For example, the electronic device may include slots formed between cards, and the operator may direct exactly one section of the airflow to each slot. Alternatively, the operator may adjust more than one vane to direct airflow from multiple sections to the same slot. Similarly, one or more vanes may be adjusted to minimize airflow to certain unused slots. The operator can manually adjust vanes by rotating them about pivot points in the vane tray.

In some instances, a vane tray may include non-adjustable vanes. In such instances, steps 606 and 608 may require replacing a vane tray in an electronic device. Other modifications to method 600 may also be made within the spirit of the invention.

Various embodiments of the invention have been described. However, the described embodiments are merely exemplary. Changes to the described embodiments may be made within the scope of the invention. For example, the described embodiments are directed to controlling airflow to cool components of an electronic device, but other embodiments may direct airflow for other reasons. For example, airflow may be directed to warm rather than cool components of an electronic device. Furthermore, vanes may be curved rather than straight.

These and other embodiments are within the scope of the following claims.

The invention claimed is:

1. An electronic device comprising:
one or more fans that contribute to an airflow through the electronic device; and a plurality of vanes adjacent to a downstream side of the one or more fans, wherein the plurality of vanes direct the airflow in more than one direction over a plurality of components in the electronic device, wherein each of the plurality of vanes include pivot points located at an upstream side of the vanes, and wherein, at the upstream side, the plurality of vanes are spaced to divide the airflow into a plurality of substantially equal sections.

2. The electronic device of claim 1, wherein the plurality of components include printed circuit boards that are arranged to form slots through which the airflow passes.

3. The electronic device of claim 2, wherein the vanes direct exactly one of the substantially equal sections to each of the slots.

4. The electronic device of claim 1, wherein the upstream side of the plurality of vanes adjacent to the one or more fans divides a net fan blade travel area of the one or more fans into substantially equal sections.

5. The electronic device of claim 1, further comprising a filter immediately following the plurality of vanes relative to the airflow, wherein the airflow passes through the filter before passing over the plurality of components.

6. The electronic device of claim 1, wherein exactly one of the plurality of substantially equal sections is directed over each one of the plurality of components.

7. The electronic device of claim 1, wherein a side of the plurality of vanes adjacent to the one or more fans divides a net fan blade travel area of the one or more fans into substantially equal sections to divide the airflow into the plurality of substantially equal sections.

8. The electronic device of claim 1, wherein each of the plurality of vanes extends in a common direction.

9. The electronic device of claim 1, wherein the vanes are part of a vane tray, the fans are part of a fan tray, and the vane tray and the fan tray have a common length and a common width.

10. The electronic device of claim 1, wherein the one or more fans is a first set of one or more fans, further comprising:
an air inlet;
a filter;
a second set of one or more fans after the plurality of components in the airflow, wherein the second set of one or more fans contributes to the airflow; and
an air outlet, wherein a air of the airflow enters the electronic device at the air inlet, then passes over the first set of one or more fans, then is directed by the plurality of vanes, then passes through the filter, then passes over the components, then passes over the second set of one or more fans, and lastly exits the electronic device at the air outlet.

11. The electronic device of claim 1, wherein the airflow functions to cool the components.

12. The electronic device of claim 1, wherein the electronic device is a network router.

13. The electronic device of claim 1, wherein the vanes may be positioned to change the distribution of the airflow of the plurality of components.

14. The electronic device of claim 1, wherein upstream sides the plurality of vanes adjacent to the one or more fans are spaced at unequal intervals to divide the airflow into a plurality of substantially equal sections.

15. A vane tray comprising:
a frame sized to fit within an electronic device; and
a plurality of vanes within the frame, wherein when in the presence of an airflow, the plurality of vanes serve to direct the airflow in more than one direction over a plurality of components in the electronic device,
wherein each of the plurality of vanes include pivot points located at an upstream side of the vanes, and
wherein, at the upstream side, the plurality of vanes are spaced to divide the airflow into a plurality of substantially equal sections.

16. The vane tray of claim 15, wherein the vanes may be positioned to change the distribution of the airflow of the plurality of components.

17. The vane tray of claim 15, wherein the vanes are spaced at unequal intervals.

18. The vane tray of claim 17, wherein the vanes extend in a common direction.

19. The vane tray of claim 15, wherein the vanes are straight.

20. A method comprising:
providing vanes within an electronic device to divide a net fan blade travel area of a cooling fan into a plurality of approximately equally-sized sections, wherein at an upstream side adjacent to the cooling fan, the vanes and are spaced at unequal intervals to divide the net fan blade travel area into the approximately equally-sized sections; and
pivoting the vanes about the pivot points located at the upstream side of the vanes to allocate airflow from each of the sections of the net fan blade travel area to components of the electronic device.

21. The method of claim 20, wherein positioning vanes requires replacing a vane tray of the electronic device.

22. The method of claim 20, wherein allocating airflow to a component consists of directing airflow to a slot adjacent to the component.

23. A vane tray comprising:
a frame sized to fit within an electronic device; and
a plurality of vanes at fixed spacing and angles within the frame,
wherein when in the presence of an airflow, the plurality of vanes serve to direct the airflow in more than one direction over a plurality of components in the electronic device, and
wherein the plurality of vanes are arranged to divide the airflow into a plurality of substantially equal sections and direct each of the plurality of substantially equal sections over separate components of the electronic device, wherein upstream sides of the vanes are spaced at unequal intervals to divide the airflow into a plurality of substantially equal sections.

* * * * *

UNITED STATES PATENT AND TRADEMARK OFFICE
CERTIFICATE OF CORRECTION

| | | |
|---|---|---|
| PATENT NO. | : 7,420,806 B1 | Page 1 of 1 |
| APPLICATION NO. | : 11/285550 | |
| DATED | : September 2, 2008 | |
| INVENTOR(S) | : Lima et al. | |

It is certified that error appears in the above-identified patent and that said Letters Patent is hereby corrected as shown below:

Column 7, line 45 (Claim 10), "wherein a air" should read -- wherein air --

Column 8, line 29 (Claim 20), "the vanes and are" should read -- the vanes are --

Signed and Sealed this

Seventeenth Day of August, 2010

David J. Kappos
*Director of the United States Patent and Trademark Office*